(12) United States Patent
Yamamoto et al.

(10) Patent No.: US 12,094,370 B2
(45) Date of Patent: Sep. 17, 2024

(54) DISPLAY DEVICE

(71) Applicant: Sony Group Corporation, Tokyo (JP)

(72) Inventors: Takeshi Yamamoto, Tokyo (JP); Soya Araki, Kanagawa (JP); Yoshinori Tachikawa, Tokyo (JP); Yohei Azuma, Tokyo (JP); Yoichiro Eshita, Tokyo (JP)

(73) Assignee: Sony Group Corporation (JP)

( * ) Notice: Subject to any disclaimer, the term of this patent is extended or adjusted under 35 U.S.C. 154(b) by 0 days.

(21) Appl. No.: 18/214,229

(22) Filed: Jun. 26, 2023

(65) Prior Publication Data

US 2023/0335021 A1    Oct. 19, 2023

Related U.S. Application Data

(63) Continuation of application No. 17/677,333, filed on Feb. 22, 2022, now Pat. No. 11,721,247, which is a
(Continued)

(30) Foreign Application Priority Data

Dec. 7, 2017   (JP) ................................. 2017-235272

(51) Int. Cl.
*G09F 9/30*  (2006.01)
*G06F 1/16*  (2006.01)
(Continued)

(52) U.S. Cl.
CPC ............ *G09F 9/301* (2013.01); *G06F 1/1652* (2013.01); *G09F 11/15* (2013.01); *G09F 11/21* (2013.01);
(Continued)

(58) Field of Classification Search
CPC .. G09F 9/301; G09F 11/21; G09F 2011/0009; G09F 11/15; G06F 1/1652;
(Continued)

(56) References Cited

U.S. PATENT DOCUMENTS 7,830,333 B2    11/2010  Aoki
8,174,628 B2 *   5/2012  Matsushita ........... G06F 1/1647
                                                    348/836
(Continued)

FOREIGN PATENT DOCUMENTS

CN    201397634 Y    2/2010
CN    101681075 A    3/2010
(Continued)

OTHER PUBLICATIONS

International Search Report from Application No. PCT/JP2018/039678 mailed Jan. 29, 2019, 2 pages.

*Primary Examiner* — Lisa Lea-Edmonds
(74) *Attorney, Agent, or Firm* — Lerner David LLP

(57) ABSTRACT

A display device includes a first rotation member configured to rotate, a second rotation member configured to rotate, the second rotation member being spaced apart from the first rotation member, a conveyance member that is extended between the first rotation member and the second rotation member, is configured to be conveyed between the first rotation member and the second rotation member in accordance with respective rotations of the first rotation member and the second rotation member, and has an inner surface and an outer surface, an abutting movement member that is disposed between the first rotation member and the second rotation member, and is configured to move to cause the conveyance member to be partially pushed up while being abutted against the inner surface, and a display member having flexibility that is attached to the outer surface, and
(Continued)

displays an image using an organic light emitting phenomenon.

8 Claims, 7 Drawing Sheets

Related U.S. Application Data continuation of application No. 16/768,384, filed as application No. PCT/JP2018/039678 on Oct. 25, 2018, now Pat. No. 11,335,218.

(51) Int. Cl.
- *G09F 11/15* (2006.01)
- *G09F 11/21* (2006.01)
- *H10K 59/00* (2023.01)
- *H10K 77/10* (2023.01)
- *G09F 11/00* (2006.01)
- *H10K 102/00* (2023.01)

(52) U.S. Cl.
CPC ............ *H10K 59/00* (2023.02); *H10K 77/111* (2023.02); *G09F 2011/0009* (2013.01); *H10K 2102/311* (2023.02)

(58) Field of Classification Search
CPC ................. H10K 59/00; H10K 77/111; H10K 2102/311; H10K 59/12; H05B 33/02
See application file for complete search history.

(56) References Cited

U.S. PATENT DOCUMENTS

| | | | |
|---|---|---|---|
| 8,199,471 B2 | 6/2012 | Bemelmans et al. | |
| 8,379,377 B2* | 2/2013 | Walters | G06F 1/1641 |
| | | | 361/679.04 |
| 8,711,566 B2* | 4/2014 | O'Brien | G06F 1/1652 |
| | | | 361/724 |
| 9,743,542 B2 | 8/2017 | Heo et al. | |
| 9,844,152 B2 | 12/2017 | Heo et al. | |
| 9,864,412 B2* | 1/2018 | Park | G06F 1/1652 |
| 9,911,369 B2 | 3/2018 | Kim et al. | |
| 10,025,355 B2* | 7/2018 | Bohn | G06F 1/1624 |
| 10,194,543 B2 | 1/2019 | Seo et al. | |
| 10,314,183 B2 | 6/2019 | Heo et al. | |
| 10,319,263 B2 | 6/2019 | Lee et al. | |
| 10,362,690 B2 | 7/2019 | Han | |
| 10,506,726 B2* | 12/2019 | Kang | H10K 77/111 |
| 10,564,676 B2* | 2/2020 | Kwon | H04N 5/64 |
| 10,582,622 B2 | 3/2020 | Kim et al. | |
| 10,588,223 B2* | 3/2020 | Han | H05K 1/028 |
| 10,684,714 B2 | 6/2020 | Seo et al. | |
| 10,908,646 B2 | 2/2021 | Kang | |
| 11,037,472 B2 | 6/2021 | Park et al. | |
| 11,194,363 B2 | 12/2021 | Kim et al. | |
| 11,335,218 B2* | 5/2022 | Yamamoto | H10K 77/111 |
| 11,721,247 B2* | 8/2023 | Yamamoto | H10K 59/12 |
| | | | 361/679.06 |
| 2013/0334981 A1 | 12/2013 | Kwack et al. | |
| 2015/0145755 A1 | 5/2015 | Yamazaki et al. | |
| 2015/0340004 A1 | 11/2015 | Pang | |
| 2016/0147261 A1 | 5/2016 | Bohn et al. | |
| 2016/0209879 A1 | 7/2016 | Ryu et al. | |
| 2016/0320804 A1 | 11/2016 | Takayanagi et al. | |
| 2016/0353588 A1 | 12/2016 | Kim et al. | |
| 2016/0374228 A1* | 12/2016 | Park | G09F 9/301 |
| 2017/0023978 A1 | 1/2017 | Cho et al. | |
| 2017/0031387 A1 | 2/2017 | Kim | |
| 2017/0060183 A1 | 3/2017 | Zhang et al. | |
| 2017/0318689 A1 | 11/2017 | Kim et al. | |
| 2017/0325342 A1 | 11/2017 | Lee | |
| 2018/0077808 A1 | 3/2018 | Seo et al. | |
| 2018/0081473 A1 | 3/2018 | Seo et al. | |
| 2018/0103550 A1 | 4/2018 | Seo et al. | |
| 2020/0043386 A1* | 2/2020 | Kim | G09F 9/301 |
| 2020/0245477 A1 | 7/2020 | Park et al. | |
| 2020/0272271 A1* | 8/2020 | Seo | H05K 5/0217 |
| 2020/0320907 A1* | 10/2020 | Yamamoto | H10K 77/111 |
| 2020/0363841 A1 | 11/2020 | Kim et al. | |
| 2022/0004229 A1* | 1/2022 | Guo | G06F 1/1652 |
| 2022/0180779 A1* | 6/2022 | Yamamoto | H10K 77/111 |
| 2023/0335021 A1* | 10/2023 | Yamamoto | G09F 11/21 |
| 2024/0059228 A1* | 2/2024 | Jang | G09F 9/301 |

FOREIGN PATENT DOCUMENTS

| | | |
|---|---|---|
| CN | 106782096 A | 5/2017 |
| CN | 107342019 A | 11/2017 |
| EP | 2557556 A2 | 2/2013 |
| EP | 3107082 B1 | 2/2020 |
| JP | 2005215648 A | 8/2005 |
| JP | 2010181899 A | 8/2010 |
| JP | 2016122206 A | 7/2016 |
| JP | 6004570 B2 | 10/2016 |
| JP | 2017198970 A | 11/2017 |
| WO | 2006038171 A1 | 4/2006 |

* cited by examiner

[ FIG. 1 ]
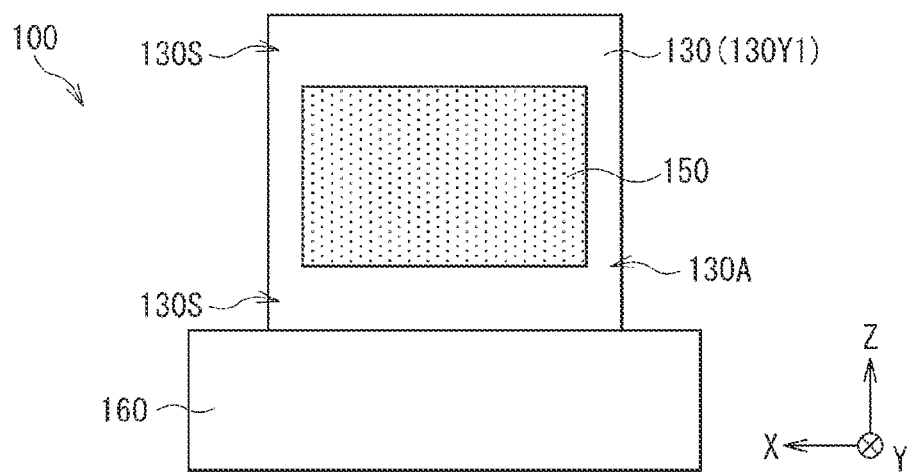
[ FIG. 2 ]
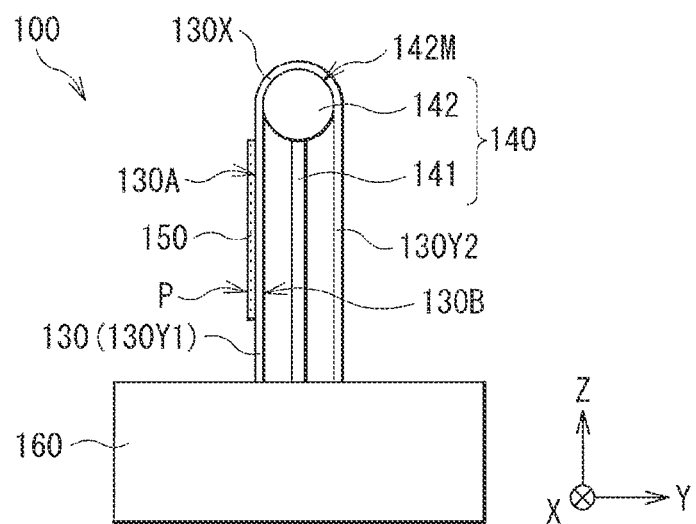

[ FIG. 3 ]
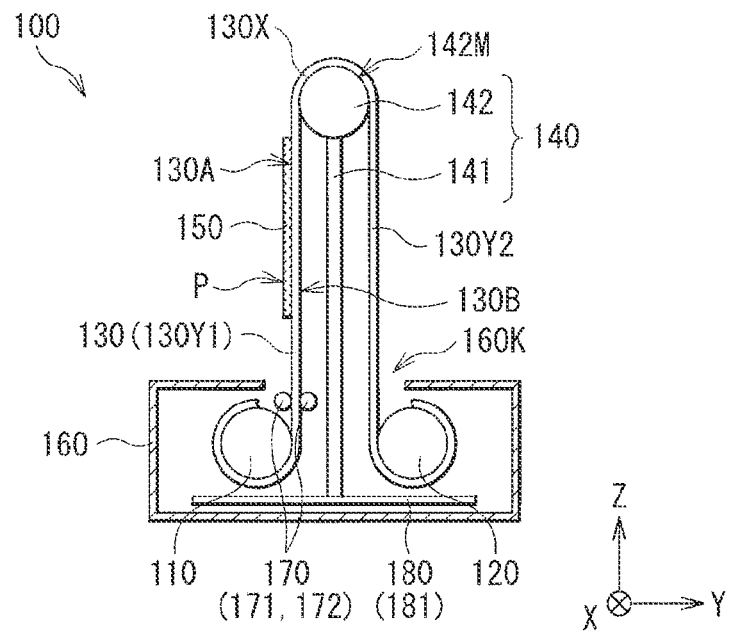
[ FIG. 4 ]
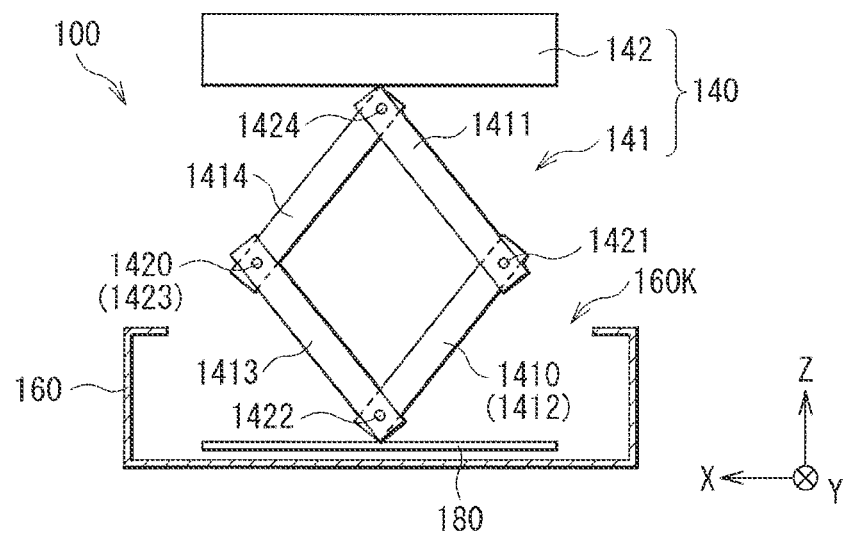

[ FIG. 5 ]
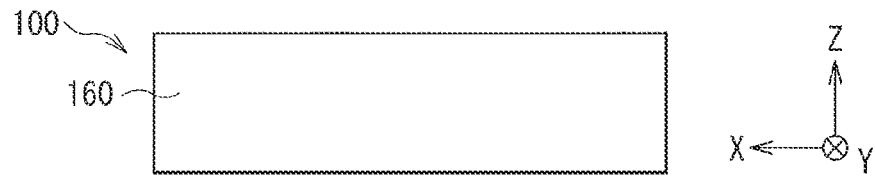
[ FIG. 6 ]
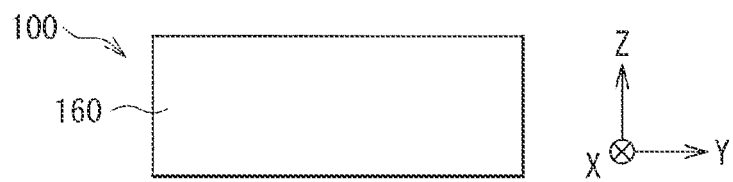
[ FIG. 7 ]
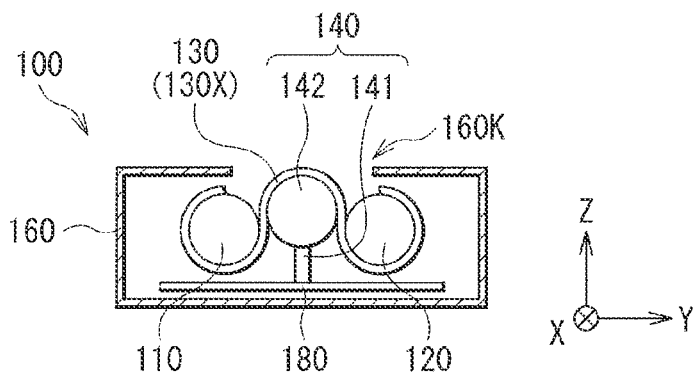
[ FIG. 8 ]
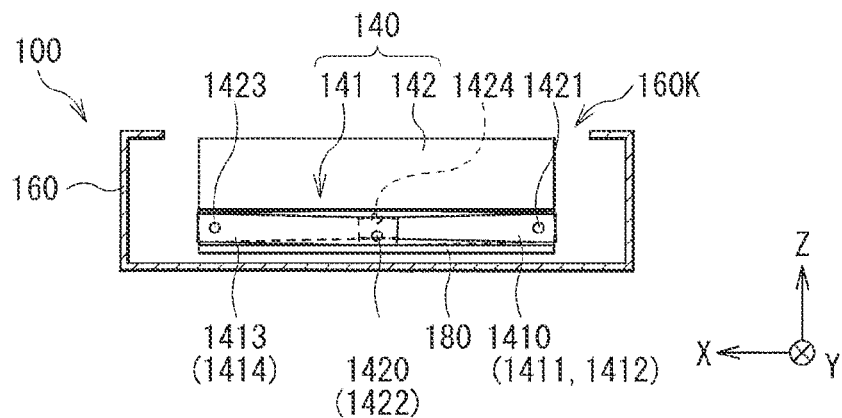

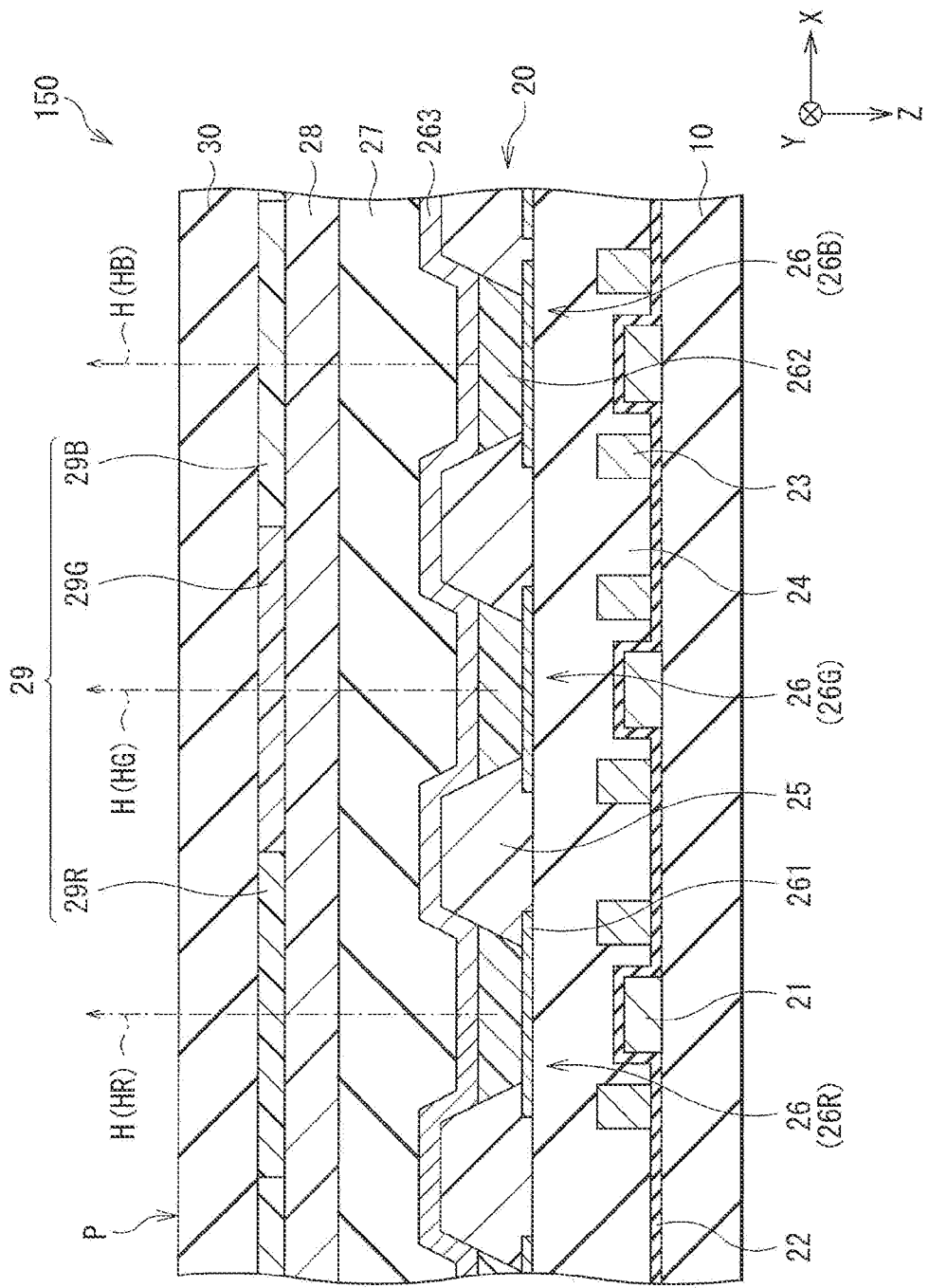
[ FIG. 9 ]

[ FIG. 10 ]
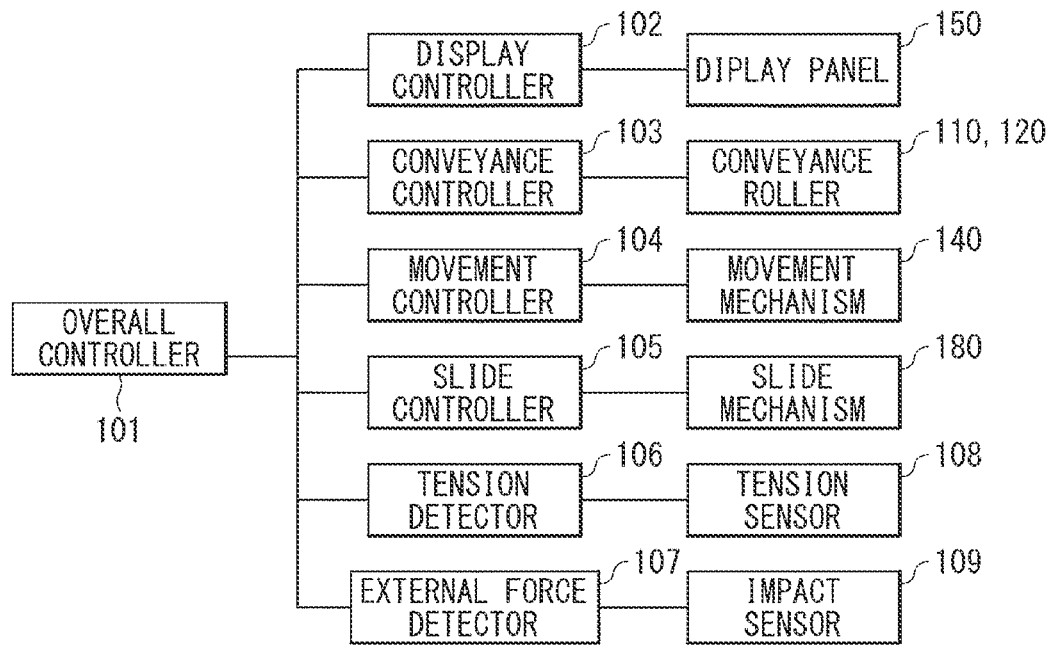
[ FIG. 11 ]
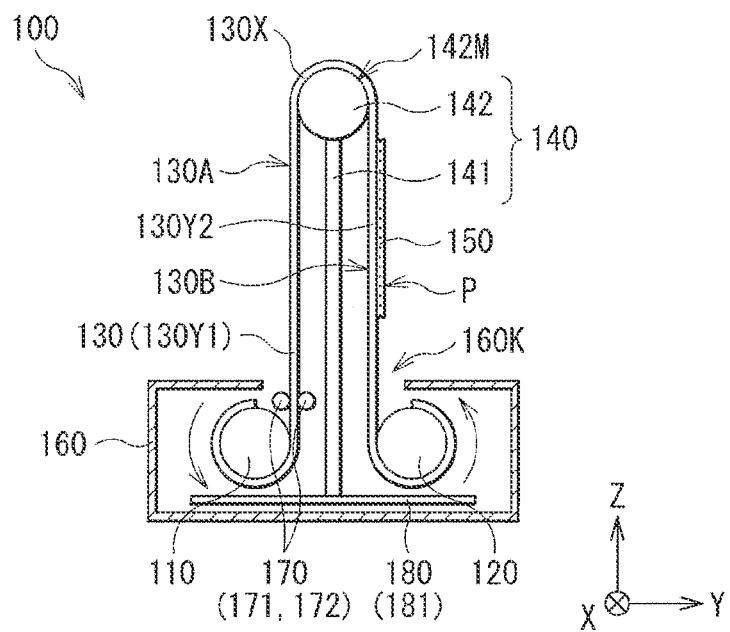

[ FIG. 12 ]
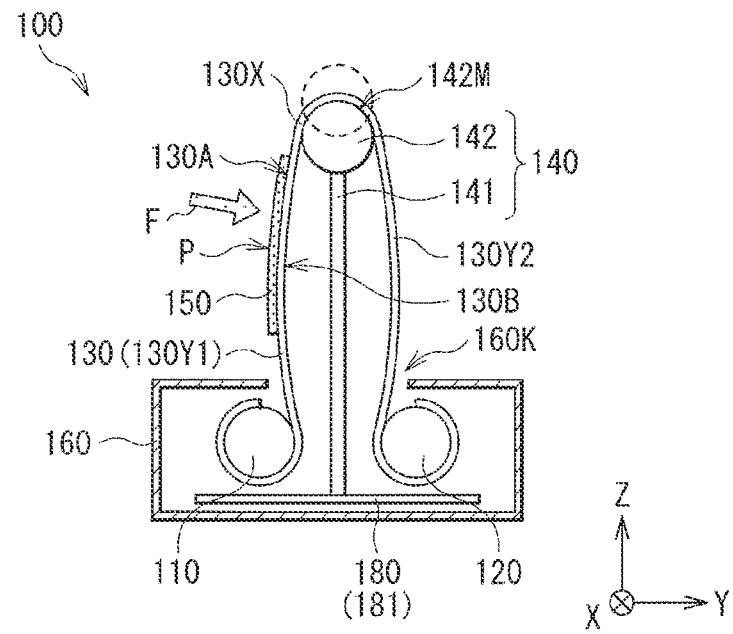
[ FIG. 13 ]
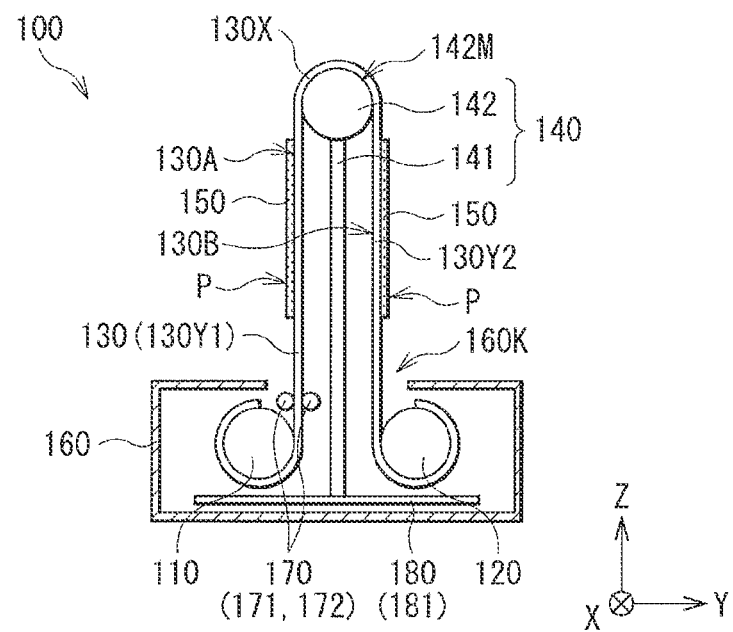

[ FIG. 14 ]
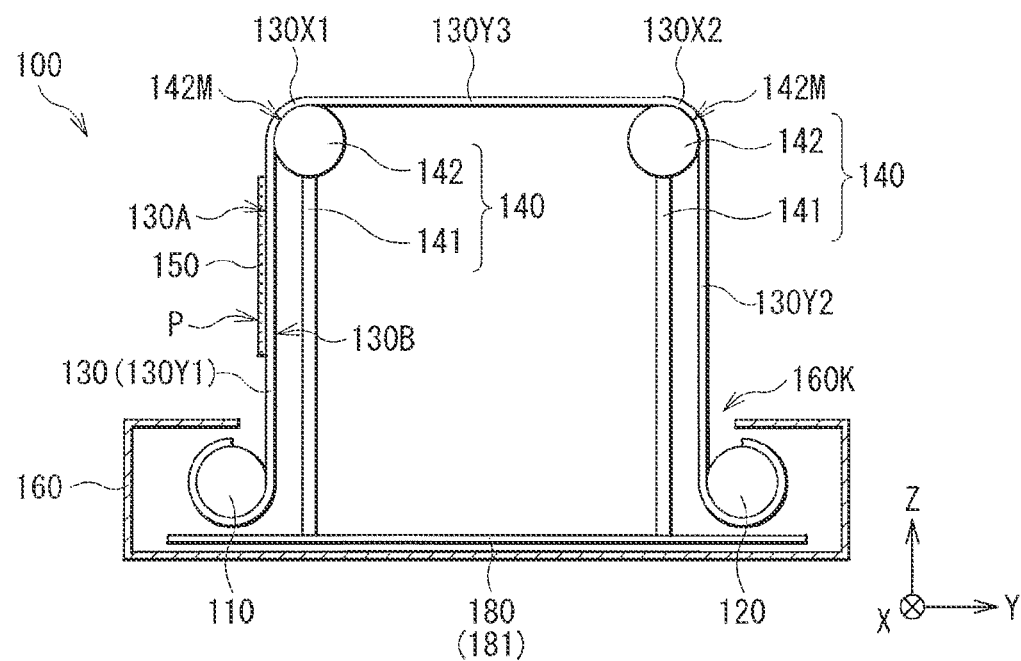
[ FIG. 15 ]
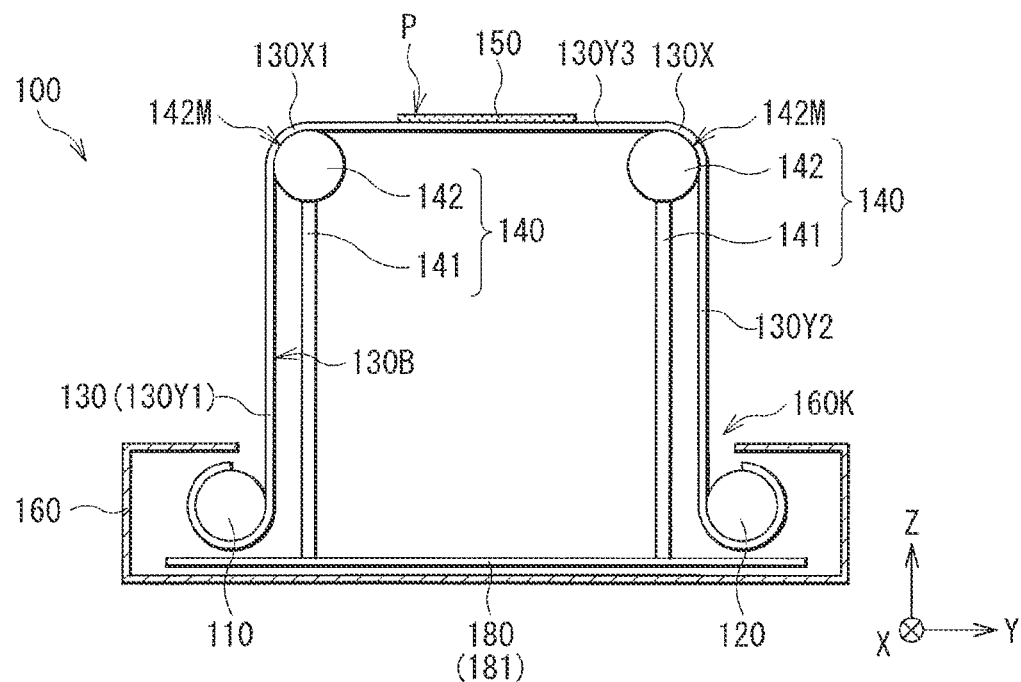

DISPLAY DEVICE

CROSS REFERENCE TO RELATED APPLICATIONS

The present application is a continuation of U.S. patent application Ser. No. 17/677,333, filed on Feb. 22, 2022, which is a continuation of U.S. patent application Ser. No. 16/768,384, filed on May 29, 2020, which is a national phase entry under 35 U.S.C. § 371 of International Application No. PCT/JP2018/039678, filed on Oct. 25, 2018, which claims the benefit of Japanese Priority Patent Application No. 2017-235272, filed on Dec. 7, 2017, the disclosures of which are hereby incorporated herein by reference.

TECHNICAL FIELD

The present technology relates to a flexible display device that displays an image using an organic light emitting phenomenon.

BACKGROUND ART

Various researches and developments have been made on a display device that displays an image using an organic light emission phenomenon, i.e., organic electroluminescence (EL).

Specifically, a display device having flexibility has been proposed (for example, see PTL1) that allows a degree of freedom regarding how the display device is used to be expanded.

SUMMARY OF THE INVENTION

Various studies have been made on a configuration of the display device that displays an image using the organic light emission phenomenon. However, the flexible display device that displays an image using the organic light emission phenomenon is still not convenient enough; therefore, there is room for improvement.

Accordingly, it is desirable to provide a display device that is able provide excellent convenience.

A display device includes a first rotation member configured to rotate, a second rotation member configured to rotate, the second rotation member being spaced apart from the first rotation member, a conveyance member that is extended between the first rotation member and the second rotation member, is configured to be conveyed between the first rotation member and the second rotation member in accordance with respective rotations of the first rotation member and the second rotation member, and has an inner surface and an outer surface, an abutting movement member that is disposed between the first rotation member and the second rotation member, and is configured to move to cause the conveyance member to be partially pushed up while being abutted against the inner surface, and a display member having flexibility that is attached to the outer surface, and displays an image using an organic light emitting phenomenon.

The display device according to the present technology is able to provide excellent convenience because: the flexible display member is attached to the conveyance member that is configured to be conveyed in accordance with the respective rotations of the first rotation member and the second rotation member; and the abutting movement member disposed between the first rotation member and the second rotation member is configured to move to cause the conveyance member to be partially pushed up.

It is to be noted that the effects described above are not necessarily limitative. With or in the place of the above effects, there may be achieved any one of the effects described in this specification or other effects that may be grasped from this specification.

BRIEF DESCRIPTION OF DRAWINGS

FIG. 1 is a plan view (front view) of a configuration of a display device according to an embodiment of the present technology, when the display device is in use.

FIG. 2 is a plan view (side view) of the configuration of the display device illustrated in FIG. 1.

FIG. 3 is a partial cross-sectional view (side view) of the configuration of the display device illustrated in FIG. 1.

FIG. 4 is a partial cross-sectional view (front view) of the configuration of the display device illustrated in FIG. 1.

FIG. 5 is a plan view (front view) of a configuration of a display device according to an embodiment of the present technology, when the display device is not in use.

FIG. 6 is a plan view (side view) of the configuration of the display device illustrated in FIG. 5.

FIG. 7 is a partial cross-sectional view (side view) of the configuration of the display device illustrated in FIG. 5.

FIG. 8 is a partial cross-sectional view (front view) of the configuration of the display device illustrated in FIG. 5.

FIG. 9 is an enlarged cross-sectional view of the configuration of the display panel illustrated in FIG. 1.

FIG. 10 is a block diagram of a configuration of a display device according to an embodiment of the present technology.

FIG. 11 is an explanatory cross-sectional view of an operation performed by the display device illustrated in FIG. 3.

FIG. 12 is an explanatory cross-sectional view of another operation performed by the display device illustrated in FIG. 3.

FIG. 13 is a partial cross-sectional view of a modification example related to a configuration of a display device.

FIG. 14 is a partial cross-sectional view of another modification related to a configuration of a display device.

FIG. 15 is an explanatory cross-sectional view of an operation performed by the display device illustrated in FIG. 14.

MODES FOR CARRYING OUT THE INVENTION

In the following, some embodiments of the present disclosure are described in detail with reference to the drawings. It is to be noted that description is given in the following order.

1. Display Device
   1-1. Overall Configuration
   1-2. Configuration of Display Panel
   1-3. Block Configuration
   1-4. Operation
   1-5. Workings and Effects
2. Modification Example

1. Display Device

First, a display device according to an embodiment of the present technology will be described.

Display device described here includes a display panel 150 to be described later that displays an image. This display panel 150 is a display that displays an image using an organic light emitting phenomenon, and is a so-called organic EL display.

The display panel 150 is flexible, is therefore a display that is foldable, and is a so-called flexible display.

[1-1. Overall Configuration]

First, an overall configuration of the display device will be described.

FIGS. 1 to 8 each illustrate a configuration of a display device 100 which is a specific embodiment of the display device. It is to be noted that FIGS. 1 to 4 each illustrate a state of the display device 100 when the display device 100 is in use, and FIGS. 5 to 8 each illustrate a state of the display device 100 when the display device 100 is not in use.

In particular, each of FIGS. 1 and 5 illustrates a plane configuration (front view) of the display device 100. Each of FIGS. 2 and 6 illustrates a plane configuration (side view) of the display device 100.

FIGS. 3 and 7 each represent a partial cross-sectional configuration (side view) of the display device 100 and respectively correspond to FIGS. 2 and 6. FIGS. 4 and 8 each represent a partial cross-sectional configuration (front view) of the display device 100 and respectively correspond to FIGS. 1 and 5. It is to be noted that, in each of FIGS. 3, 4, 7, and 8, only a cross section of a housing 160 to be described later is illustrated.

As illustrated in FIGS. 1 to 8, for example, the display device 100 includes conveyance rollers 110 and 120, a conveyance sheet 130, a movement mechanism 140, the display panel 150, the housing 160, a cleaning mechanism 170, and a slide mechanism 180.

Hereinafter, for convenience, the left side in FIG. 2 is referred to as "front", the right side in FIG. 2 is referred to as "back", the upper side in FIG. 2 is referred to as "top", and the lower side in FIG. 2 is referred to as "bottom". Thus, for example, in FIGS. 2 and 3, a display surface P of the display panel 150 faces the front; therefore, the display panel 150 displays an image toward the front. The "display surface P" is a surface on which the display panel 150 displays the image.

[Housing]

The housing 160 is a box-shaped member configured to store a series of components of the display device 100 and to cause some of the series of components to be drawn out as necessary. Here, the housing 160 serves as a "storage member" of one embodiment of the present technology.

The "series of components" described herein includes, for example, the conveyance rollers 110 and 120, the conveyance sheet 130, the movement mechanism 140, and the display panel 150. In addition, "some of the series of components" are, for example, the conveyance sheet 130, the movement mechanism 140, the display panel 150, and the like.

A top surface of housing 160 is provided with, for example, an opening 160K that draws out the conveyance sheet 130, the movement mechanism 140, the display panel 150, and the like.

[Conveyance Roller]

The conveyance rollers 110 and 120 are each a cylindrical member that conveys the conveyance sheet 130. Here, the conveyance roller 110 serves as a "first rotation member" of one embodiment of the present technology, and the conveyance roller 120 serves as a "second rotation member" of one embodiment of the present technology.

The conveyance rollers 110 and 120 are stored in the housing 160. The conveyance roller 110 is spaced apart from the conveyance roller 120 and, more specifically, is disposed, for example, in front of the conveyance roller 120. The conveyance rollers 110 and 120 each extend, for example, in an X-axis direction and are each rotatable about the X-axis (as a rotation axis).

It is to be noted that each of the conveyance roller 110 and 120 is supported by the slide mechanism 180 so as to be rotatable, for example.

[Conveyance Sheet]

The conveyance sheet 130 is a strip-shaped member that is conveyed to move the display panel 150. The conveyance sheet 130 serves as a "conveyance member" of one embodiment of the present technology.

The conveyance sheet 130 extends, for example, in a Y-axis direction and has an outer surface 130A and an inner surface 130B. The outer surface 130A is a so-called front surface of the conveyance sheet 130 (i.e., a surface visible from outside), and the inner surface 130B is a so-called back surface of the conveyance sheet 130 (i.e., a surface invisible from outside).

One end in the extending direction of the conveyance sheet 130 is fixed to, for example, the conveyance roller 110, and the other end in the extending direction of the conveyance sheet 130 is fixed to, for example, the conveyance roller 120. Thus, the conveyance sheet 130 is extended between the conveyance rollers 110 and 120, and is therefore able to be conveyed between the conveyance rollers 110 and 120 in accordance with the respective rotations of the conveyance rollers 110 and 120.

Specifically, for example, in a case where the conveyance sheet 130 is unwound in accordance with the rotation of the conveyance roller 110 and the conveyance sheet 130 is wound in accordance with the rotation of the conveyance roller 120, it is possible to convey the conveyance sheet 130 from the conveyance roller 110 to the conveyance roller 120.

In contrast, for example, in a case where the conveyance sheet 130 is unwound in accordance with the rotation of the conveyance roller 120 and the conveyance sheet 130 is wound in accordance with the rotation of the conveyance roller 110, it is possible to convey the conveyance sheet 130 from the conveyance roller 120 to the conveyance roller 110.

A method of winding the conveyance sheet 130 by each of the conveyance rollers 110 and 120 is not particularly limited. Here, the conveyance sheet 130 is wound by the conveyance roller 110 to cause the outer surface 130A to be adjacent to the conveyance roller 110, and is wound by the conveyance roller 120 to cause the outer perimeter surface 130A to be adjacent to the conveyance roller 120, for example.

It is to be noted that, as will be described later, the conveyance sheet 130 includes an adjacent part 130X and a non-adjacent part 130Y, in a state in which a support 142 is moved to cause the conveyance sheet 130 to be partially pushed up while being abutted against the inner surface 130B, that is, in a state in which the support 142 is moved to a raised position. The adjacent part 130X is a part adjacent to an outer perimeter surface 142M of the support 142 and the non-adjacent part 130Y is a part that is not adjacent to the outer perimeter surface 142M of the support 142.

Here, for example, the display device 100 has one movement mechanism 140; therefore, the conveyance sheet 130 includes one adjacent part 130X and two non-adjacent parts 130Y (130Y1 and 130Y2) when the support 142 moves up to the raised position. The non-adjacent part 130Y1 is, for example, a part located between the conveyance roller 110 and the movement mechanism 140 (the support 142). The non-adjacent part 130Y2 is a part located between the conveyance roller 120 and the movement mechanism 140 (the support 142).

The material of the conveyance sheet 130 is not particularly limited. However, it is preferable that the conveyance sheet 130 be flexible similarly to the display panel 150. One reason is that the conveyance sheet 130 is allowed to be curved easily, and is therefore easily wound by each of the conveyance rollers 110 and 120, and easily conveyed along the outer perimeter surface 142M of the support 142. Specifically, the conveyance sheet 130 includes, for example, a polymer sheet or the like which contains polyimide.

Further, a thickness of the conveyance sheet 130 is not particularly limited, and is freely set in relation to the flexibility of the conveyance sheet 130 described above or the like.

[Movement Mechanism]

The movement mechanism 140 is a mechanism that partially moves the conveyance sheet 130 in a direction (Z-axis direction) that intersects a conveyance direction (Y-axis direction) of the conveyance sheet 130.

The movement mechanism 140 is disposed between the conveyance rollers 110 and 120, and is movable in the Z-axis direction while being abutted against the inner surface 130B of the conveyance sheet 130. Thus, the movement mechanism 140 is able to push up a portion of the conveyance sheet 130 and return the portion of the conveyance sheet 130 to a substantially flat state.

Specifically, the movement mechanism 140 includes an elongating/shortening part 141 and the support 142, as illustrated in FIGS. 4 and 8, for example. However, FIGS. 4 and 8 each illustrate a state in which the conveyance rollers 110 and 120, the conveyance sheet 130, the display panel 150, and the cleaning mechanism 170 are omitted, to make the configuration (the elongating/shortening part 141 and the support 142) of the movement mechanism 140 easier to see. Here, the support 142 serves as an "abutting movement member" of one embodiment of the present technology.

[Elongating/Shortening Part]

The elongating/shortening part 141 is, for example, a member that is able to elongate and shorten in the Z-axis direction, and is, for example, a linkage in which a plurality of pivot plates 1410 is linked to each other to be pivotable about a plurality of pivot pins 1420. The plurality of pivot plates 1410 is disposed, for example, in a zigzag shape, and thus the elongating/shortening part 141 is able to elongate and shorten in the Z-axis direction, for example, by the plurality of pivot plates 1410 pivoting about the plurality of pivot pins 1420 (as a pivot)

FIG. 4 illustrates a state in which the elongating/shortening part 141 is elongated by the plurality of pivot plates 1410 pivoting so as to be spaced apart from each other. FIG. 8, illustrates a state in which the elongating/shortening part 141 is shortened by the plurality of pivot plates 1410 pivoting so as to be close to each other.

In each of FIGS. 4 and 8, for simplifying the illustrated contents, four pivot plates 1410 (1411 to 141) are linked to each other via four pivot pins 1420 (1421 to 1424), for example. However, the respective numbers of pivot plates 1410 and pivot pins 1420 are not particularly limited.

Here, for example, one end of the pivot plate 1411 and one end of the pivot plate 1412 are linked to each other via the pivot pin 1421, and the other end of the pivot plate 1412 and one end of the pivot plate 1413 are linked to each other via the pivot pin 1422. Further, the other end of the pivot plate 1413 and one end of the pivot plate 1414 are linked to each other via the pivot pin 1423, and the other end of the pivot plate 1414 and the other end of pivot plate 1411 are linked to each other via the pivot pin 1424.

The pivot plates 1412 and 1413 are each supported by the slide mechanism 180, for example, so as to be pivotable, and the pivot plates 1411 and 1414 are each linked to the support 142, for example, so as to be pivotable.

[Support]

The support 142 is a member that is abutted against the inner surface 130B of the conveyance sheet 130, to move the conveyance sheet 130 while supporting a portion of the conveyance sheet 130 in accordance with an elongating/shortening operation of the elongating/shortening part 141.

Specifically, the support 142 is movable between the raised position and a lowered position using, for example, the elongating/shortening operation of elongating/shortening part 141.

FIGS. 1 to 3 each illustrate a state in which the elongating/shortening part 141 is elongated (FIG. 4), thus the support 142 is drawn out of the housing 160 together with the elongating/shortening part 141, and the support 142 is in the raised position. In this case, a portion of the conveyance sheet 130 is pushed up by the support 142, thus the conveyance sheet 130 is able to be conveyed along the outer perimeter surface 142M of the support 142.

FIGS. 5 to 7 each illustrate a state in which the elongating/shortening part 141 is shortened (FIG. 8), thus the support 142 is stored in the housing 160 together with the elongating/shortening part 141 and the support 142 is in the lowered position. In this case, the support 142 is lowered and the conveyance sheet 130 is wound by one or both of the conveyance rollers 110 and 120, and thus the conveyance sheet 130 is able to be stored in the housing 160.

However, the support 142 may be located at any position between the raised position and the lowered position, as necessary.

A three-dimensional shape of the support 142 is not particularly limited, and may be a cylindrical, a prism, or any other shape. Among these, it is preferable that support 142 be a cylindrical member extending in the Y-axis direction, in a similar manner to each of the conveyance rollers 110 and 120. This is because the support 142 has the outer perimeter surface 142M having a curved shape, and the conveyance sheet 130 is easily conveyed along the outer perimeter surface 142M.

Here, a positional relationship between each of the conveyance rollers 110 and 120 and the movement mechanism 140 is not particularly limited as long as the movement mechanism 140 is disposed between the conveyance rollers 110 and 120.

However, the display panel 150 is attached to the non-adjacent part 130Y1 of the conveyance sheet 150, for example, as will be described later. In such a case, to make it easier for a user of the display device 100 (hereafter simply referred to as the "user") to see the display panel 150, i.e. to make it easier for the user to face the display surface P, the conveyance roller 110 and the movement mechanism 140 are preferably disposed to cause the non-adjacent part 130Y1 to extend substantially vertically, as illustrated in FIGS. 2 and 3.

In addition, for example, as described later, there is also a case where the display panel 150 is disposed on the non-adjacent part 130Y2 by the conveyance sheet 130 being conveyed while supporting the display panel 150 (see FIG. 11). Also in this case, to make it easier for the user to see the display panel 150, the conveyance roller 120 and the movement mechanism 140 are preferably disposed to cause the non-adjacent part 130Y2 to extend substantially vertically.

[Display Panel]

The display panel 150 is a member that displays an image. Here, the display panel 150 serves as a "display member" of one embodiment of the present technology.

The display panel 150 is attached to the outer surface 130A of the conveyance sheet 130. The display panel 150 is thus movable in accordance with the conveyance of the conveyance sheet 130.

In particular, the display panel 150 is flexible, as described above. One reason is that, similarly to the case described regarding the conveyance sheet 130, the display panel 150 is allowed to be curved easily, and is therefore easily wound by each of the conveyance rollers 110 and 120, and easily conveyed along the outer perimeter surface 142M of the support 142.

With the support 142 moved to the raised position, the display panel 150 is preferably located near the center of the non-adjacent part 130Y1 in the Z-axis direction, as illustrated in FIG. 1. That is, it is preferable that a blank space 130S be provided at upstream side of the display panel 150 in the conveyance direction of the conveyance sheet 130, and a blank space 130S is also provided at downstream side of the display panel 150 in the conveyance direction of the conveyance sheet 130. The blank space 130S is a region of the non-adjacent part 130Y1 to which the display panel 150 is not attached. This makes it possible to adjust a position of the display panel 150 in the conveyance direction of the conveyance sheet 130, as will be described later.

It is to be noted that the detailed configuration of the display panel 150 will be described later (see FIG. 9).

[Cleaning Mechanism]

The cleaning mechanism 170 is a mechanism for cleaning the outer surface 130A and the inner surface 130B of the conveyance sheet 130. The cleaning mechanism 170 removes foreign matters such as dust and dust stuck to the outer surface 130A and the inner surface 130B, for example.

In particular, the cleaning mechanism 170 is able to clean not only the outer surface 130A of the conveyance sheet 130, but also the display surface P of the display panel 150 attached to the conveyance sheet 130. The cleaning mechanism 170 serves as a "cleaning member" of one embodiment of the present technology.

Specifically, the cleaning mechanism 170 is disposed along a conveyance path of the conveyance sheet 130, and includes a pair of cleaning rollers 171 and 172 opposed to each other via the conveyance sheet 130, for example. Each of the cleaning rollers 171 and 172 is, for example, a cylindrical member extending in the X-axis direction, similarly to the conveyance rollers 110 and 120, and is rotatable about its X-axis.

Specifically, the cleaning rollers 171 and 172 are each preferably a cylindrical component whose outer perimeter surface is coated with a cleaning cloth, the cleaning cloth having an antistatic property, for example. The cleaning roller 171 is, for example, pressed against the outer surface 130A of the conveyance sheet 130 and the cleaning roller 172 is, for example, pressed against the inner surface 130B of the conveyance sheet 130. As a result, the conveyance sheet 130 is nipped, for example, by the cleaning rollers 171 and 172, each of the cleaning rollers 171 and 172 is rotatable, for example, in accordance with the conveyance of the conveyance sheet 130.

As described above, since the display panel 150 is flexible, physical durability of the display panel 150 may not necessarily be adequate. In this case, if a user or the like tries to clean the display surface P of the display panel 150 manually and directly using a cleaning cloth (e.g., cleaning by wiping), the display panel 150 may be damaged unintentionally due to the pressure generated when the cleaning cloth is pressed against the display surface P. In contrast, when the cleaning rollers 171 and 172 are used, the display surface P is cleaned by the cleaning rollers 171 and 172 using the conveyance operation of the conveyance sheet 130. Therefore, if a so-called nip pressure is appropriately suppressed, the display surface P is cleaned by the cleaning rollers 171 and 172 while preventing the display panel 150 from being damaged. This not only suppresses the damage of the display panel 50, but also suppresses damage of the conveyance sheet 130 having flexibility similarly to the display panel 150.

In this case, in particular, when a foreign matter such as dust is stuck to the display surface P and in a case where the display panel 150 is wound by each of the conveyance rollers 110 and 120, the display panel 150 is liable to be damaged due to the foreign matter being strongly pressed against the display surface P. However, if the cleaning rollers 171 and 172 are used, the foreign matter stuck to the display surface P is removed by the cleaning rollers 171 and 172, which makes it difficult that the display panel 150 is damaged at the time of being wound.

It is to be noted that, although not specifically illustrated here, it is preferable that the cleaning mechanism 170 include brushes together with the cleaning rollers 171 and 172. The brushes are preferably located at the upstream side of the cleaning rollers 171 and 172 in the conveyance direction of the conveyance sheet 130. However, the brushes may also be disposed at the downstream side of the cleaning rollers 171 and 172 in the conveyance direction of the conveyance sheet 130. When the display panel 150 is pressed against the cleaning rollers 171 and 172 in a state in which the foreign matter such as dust stuck to the display surface P, the display panel 150 is liable to be damaged due to the foreign matter similarly as the case where the display panel 150 is wound by each of the conveyance rollers 110 and 120. Therefore, it is preferable that the brushes remove the foreign matter stuck to the display surface P prior to the display surface P being pressed against the cleaning rollers 171 and 172. In this case, after the foreign matter stuck to the display surface P is removed by the brushes, an oil content (e.g., a fingerprint) stuck to the display surface P is wiped off by the cleaning rollers 171 and 172. It is to be noted that, as long as it is possible to remove the foreign matter stuck to the display surface P, it is not limited to the brushes, and other members may be used.

An installation location of the cleaning mechanism 170 is not particularly limited. Here, for example, as illustrated in FIG. 3, the cleaning mechanism 170 is attached to the non-adjacent part 130Y1 inside the housing 160. However, in FIG. 7 and FIG. 12 to be described later, illustration of the cleaning mechanism 170 is omitted.

[Slide Mechanism]

The slide mechanism 180 is a mechanism that slidingly (parallelly) moves the conveyance rollers 110 and 120 and the movement mechanism 140 in the direction (Y-axis direction) intersecting a movement direction (Z-axis direction) of the support 142 while keeping the position of the housing 160 fixed. That is, the slide mechanism 180 is able to slide back and forth the conveyance rollers 110 and 120 and the movement mechanism 140.

The slide mechanism 180 includes, for example, a slide plate 181 that supports the conveyance rollers 110 and 120 and the movement mechanism 140, and is movable back and forth using power such as a motor. With the slide plate 181 supporting the conveyance rollers 110 and 120 and the movement mechanism 140 and moving back and forth, the conveyance sheet 130 extended between the conveyance rollers 110 and 120 and the display panel 150 attached to the conveyance sheet 130 are also movable back and forth similarly. Here, the slide plate 181 serves as a "support movement member" of one embodiment of the present technology.

[1-2. Configuration of Display Panel]

Next, a configuration of the display panel 150 will be described. However, the configuration of the display panel 150 described below is only one specific example, and the configuration of the display panel 150 is not limited to the configuration described below.

FIG. 9 is an enlarged cross-sectional configuration of the display panel 150 illustrated in FIG. 1. It is to be noted that, in FIG. 9, a dimension of an image display layer 20 in the Z-axis direction is made larger than the respective dimensions of a support base 10 and a protective base 30 in the Z-axis direction, in order to make the configuration of display panel 150 easier to see.

A display format of the display panel 150 described here is, for example, a top emission type in which light H for displaying an image generated in the image display layer 20 is emitted outside through the protective 30. Thus, the image is displayed on a surface (the display surface P) on which the protective base 30 is disposed.

The display panel 150 is, for example, as illustrated in FIG. 9, a stack in which the support base 10, the image display layer 20, and the protective base 30 are stacked in this order. That is, the image display layer 20 is sandwiched between the support base 10 and the protective base 30, for example.

[Support Base]

The support base 10 is a base that has flexibility and supports the image display layer 20. A material of the support base 10 is not particularly limited as long as the flexibility is able to be ensured. Specifically, the support base 10 is, for example, a polymer sheet or the like which contains polyimide. The support base 10 serves as a "flexible base" of one embodiment of the present technology.

[Protective Base]

The protective base 30 is a base that has flexibility and protects the image display layer 20, and has a similar configuration as the flexible base 10 described above, for example. However, a material of the protective base 30 may be the same as the material of the support base 10, or may be different from the material of the support base 10.

[Image Display Layer]

The image display layer 20 is a layer that displays an image using an organic light emitting phenomenon. The image display layer 20 is disposed on the support base 10, for example, and is thus supported by the flexible base 10, and the image display layer 20 is covered by the protective base 30, for example, and is thus protected by the protective base 30.

The image display layer 20 includes, for example, a plurality of organic light emitting elements 26 that emits the light H using the organic light emitting phenomenon. Here, the image display layer 20 includes, for example, a red organic light emitting element 26R that emits red light HPR (e.g., wavelength=about 620 nm), a green organic light emitting element 26G that emits green light HPG (e.g., wavelength=about 530 nm), and a blue organic light emitting element 26B that emits blue light HPB (e.g., wavelength=about 460 nm).

Specifically, the image display layer 20 includes, for example, a plurality of driving elements 21, an interlayer insulating layer 22, a plurality of driving wiring lines 23, a planarizing insulating layer 24, an in-layer insulating layer 25, the red organic light emitting element 26R, the green organic light emitting element 26G, the blue organic light emitting element 26B, a protective layer 27, an adhesion layer 28, and a color filter 29. The series of components included in the image display layer 20 are stacked in this order, for example, by being formed in this order on one side of the support base 10.

[Plurality of Driving Elements]

The plurality of driving elements 21 drives each of the red organic light emitting element 26R, the green organic light emitting element 26G, and the blue organic light emitting element 26B, and is disposed in a matrix, for example. Each of the plurality of driving elements 21 is, for example, a thin film transistor (TFT) or the like and is coupled to a driving wiring line 23.

[Interlayer Insulating Layer]

The interlayer insulating layer 22 is a layer that electrically separates the plurality of driving elements 21 from the surroundings, and includes any one or two or more of insulating materials such as silicon oxide ($SiO_2$), PSG (phospho-silicate glass), and the like, for example. The interlayer insulating layer 22 is formed, for example, so as to cover the plurality of driving elements 21 and the support base 10 around the driving elements 21.

[Plurality of Driving Wiring Lines]

The plurality of driving wiring lines 23 is a wiring that serves as a signal line for driving each of the red organic light emitting element 26R, the green organic light emitting element 26G, and the blue organic light emitting element 26B, and includes, for example, any one or two or more of conductive materials such as aluminum (Al), an aluminum copper alloy (AlCu), and the like. The plurality of driving wiring lines 23 is each coupled to the corresponding one of the red organic light emitting element 26R, the green organic light emitting element 26G, and the blue organic light emitting element 26B. It is to be noted that two driving wiring lines 23 are provided for each driving element 21, for example, and the two driving wiring lines 23 function as a gate signal line and a gate signal line, for example.

[Planarizing Insulating Layer]

The planarizing insulating layer 24 is a layer that electrically separates the driving elements 21 and the driving wiring lines 23 from the red organic light emitting element 26R, the green organic light emitting element 26G, and the blue organic light emitting element 26B. The planarizing insulating layer 24 also serves as a layer for planarizing a base layer on which the red organic light emitting element 26R, the green organic light emitting element 26G, and the blue organic light emitting element 26B are each disposed. The planarizing insulating layer 24 includes, for example, any one or two or more of insulating materials such as silicon oxide ($SiO_2$) and the like.

[Red Organic Light Emitting Element, Green Organic Light Emitting Element, and Blue Organic Light Emitting Element]

The red organic light emitting element 26R, the green organic light emitting element 26G, and the blue organic light emitting element 26B are disposed in a matrix in a similar manner as the driving element 21. The image display layer 20 includes a plurality of sets of red organic light emitting elements 26R, green organic light emitting elements 26G, and blue organic light emitting elements 26B, one set including the red organic light emitting element 26R, the green organic light emitting element 26G, and the blue organic light emitting element 26B.

The red organic light emitting element 26R includes, for example, a lower electrode layer 261, an organic light emitting layer 262, and an upper electrode layer 263. The lower electrode layer 261, the organic light emitting layer 262, and the upper electrode layer 263 are stacked in this order on the planarizing insulating layer 24, for example.

The lower electrode layer 261 is an individual electrode disposed in a matrix in a similar manner to the plurality of driving elements 21, and includes, for example, any one or two or more of conductive materials such as silver (Ag), gold (Au), and the like.

The organic light emitting layer 262 is a layer that emits red light HR, and is a stack including a plurality of layers, for example. The plurality of layers may include any one or two or more of a hole injection layer, a hole transport layer, an electron injection layer, a hole transport layer, and the like, for example, as well as a light emitting layer for generating the red light HR.

The upper electrode layer 263 is a common electrode extending through each of the red organic light emitting element 26R, the green organic light emitting element 26G, and the blue organic light emitting element 26B, which is different from the lower electrode layer 261 (an individual electrode) disposed in a matrix. The upper electrode 263 include, for example, any one or two or more of light-transmissive conductive materials such as indium tin oxide (ITO) and the like to direct the red light HR emitted from the organic light emitting layer 262 to the protective base 30.

The green organic light emitting element 26G has, for example, a similar configuration as the red organic light emitting element 26R, except that the green organic light emitting element 26G includes the organic light emitting layer 262 that generates the green light HG instead of the organic light emitting layer 262 that generates the red light HR. The blue organic light emitting element 26B has, for example, a similar configuration as the red organic light emitting element 26R, except that the blue organic light emitting element 26B includes the organic light emitting layer 262 that generates the blue light HB instead of the organic light emitting layer 262 that generates the red light HR.

[In-Layer Insulating Layer]

The in-layer insulating layer 26 is a layer for separating the red organic light emitting element 26R, the green organic light emitting element 26G, and the blue organic light emitting element 26B from each other, and includes any one or two or more of insulating materials such as polyimides and the like, for example.

[Protective Layer]

The protective layer 27 is a layer for protecting the red organic light emitting element 26R, the green organic light emitting element 26G, and the blue organic light emitting element 26B, and includes any one or two or more of light-transmissive dielectric materials such as silicon nitride (SiN) and the like, for example.

[Adhesion Layer]

The adhesion layer 28 is a layer that adheres the protective layer 27 and the color filter 29 to each other, and includes any one or two or more of adhesives, such as light-transmissive thermosetting resins and the like, for example.

[Color Filter]

The color filter 29 is a member that transmits the red light HR, the green light HG, and the blue light HB respectively generated in the red organic light emitting element 26R, the green organic light emitting element 26G, and the blue organic light emitting element 26B. It is to be noted that, the color filter 29 also serves to prevent contrast from decreasing due to the penetration of external light into an interior of the image display layer 20.

The color filter 29 includes, for example, a red filter region 29R corresponding to the red organic light emitting element 26R, a green filter region 29G corresponding to the green organic light emitting element 26G, and a blue filter region 29B corresponding to the blue organic light emitting element 26B.

[1-3. Block Configuration]

Next, a block configuration of the display device 100 will be described.

FIG. 10 illustrates a block configuration of the display device 100. However, FIG. 10 also illustrates some of the components that have already been described above.

The display device includes, for example, as illustrated in FIG. 10, an overall controller 101, a display controller 102, a conveyance controller 103, a movement controller 104, a slide controller 105, a tension detector 105, an external force detector 107, a tension sensor 108, and an impact sensor 109.

[Overall Controller]

The overall controller 101 controls an entire operation of the display device 100. The overall controller 101 includes, for example, a central processing unit (CPU) and a memory.

[Display Controller]

The display controller 102 controls a display operation of the display panel 150.

Specifically, the support 142 is moved to the raised position in accordance with the elongating operation of the elongating/shortening part 141 and the display panel 150 is moved in accordance with the conveyance operation of the conveyance sheet 130, thus, the display panel 150 is drawn out from the housing 160, and the display controller 102 drives the display panel 150, for example. This causes the display panel 150 to start displaying an image.

In contrast, the support 142 is moved to the lowered position in accordance with the shortening operation of the elongating/shortening part 141 and the display panel 150 is moved in accordance with the conveyance operation of the conveyance sheet 130, thus, the display panel 150 is stored in the housing 160, and the display controller 102 stops the display panel 150, for example. Thus, the display panel 150 stops displaying the image.

However, for example, instead of automatically switching the activation and stop of the display panel 150 in accordance with the drawing out and the position of the display panel 150 as described above, the display controller 102 may switch the activation and stop of the display panel 150 in accordance with a user's operation.

In particular, as will be described later, when display panel 150 moves in accordance with the conveyance operation of the conveyance sheet 130 and the display panel 150 is located on the non-adjacent part 130Y2 (see FIG. 11), the display controller 102 inverts the top and bottom of an image displayed by the display panel 150, for example. This makes it easier for the user to view the image also in a case where the display panel 150 displays the image toward the back by the display surface P facing the back.

However, for example, instead of inverting the top and bottom of the image in accordance with the position of the display panel 150 as described above, the display controller 102 may invert the top and bottom of the image in accordance with the user's operation.

[Conveyance Controller]

The conveyance controller 103 controls the conveyance operation of the conveyance sheet 130 by controlling the respective rotation operations of the conveyance rollers 110 and 120. The conveyance controller 103 includes, for example, a drive source such as a motor, for rotating each of the conveyance rollers 110 and 120.

Specifically, the conveyance controller 103 moves the display panel 150 together with the conveyance sheet 130 by rotating each of the conveyance rollers 110 and 120, for example, in accordance with the user's operation. In this case, the conveyance controller 103 able to move the conveyance sheet 130 toward the front and is also able to move the conveyance sheet 130 toward the back, by changing the respective rotation directions of the conveyance rollers 110 and 120, for example.

Further, when the support 142 moves to the raised position in accordance with the elongating operation of the elongating/shortening part 142, for example, the conveyance controller 103 conveys the conveyance sheet 130 until the display panel 150 is disposed on the non-adjacent part 130Y1. That is, the conveyance controller 103 is able to adjust a conveyance distance of the conveyance sheet 130 to cause the display panel 150 to be disposed on the non-adjacent part 130Y1 in accordance with the respective rotations of the conveyance rollers 110 and 120, for example. This allows the display panel 150 to display an image toward the front because the display surface P faces the front.

However, the conveyance controller 103 may move the conveyance sheet 130 until the display panel 150 is located on the non-adjacent part 130Y2, for example, when the support 142 moves to the raised position. In this case, the display surface P faces the back, thus, the display panel 150 is able to display an image toward the back.

In addition, the conveyance controller 103 adjusts a rotation direction and a rotation amount of each of the conveyance rollers 110 and 120 in a state in which the display panel 150 is disposed on the non-adjacent part 130Y1, for example, thereby adjusting the position of the display panel 150 in the Z-axis direction. That is, the conveyance controller 103 is able to adjust the position of the display panel 150 in the conveyance direction of the conveyance sheet 130 in accordance with the respective rotations of the conveyance rollers 110 and 120, for example. In this case, for example, the conveyance controller 103 is able to move the conveyance sheet 130 toward the front to lower the position of the display panel 150 and move the conveyance sheet 130 toward the back to raise the position of the display panel 150 in in accordance with the user's operation.

[Movement Controller]

The movement controller 104 controls a movement operation of the support 142, that is, the elongating/shortening operation of the elongating/shortening part 141. The movement controller 104 switches the operation of the movement mechanism 140 in accordance with the user's operation.

Specifically, the movement controller 104 draws out the support 142 from inside the housing 160 and moves the support 142 to the raised position by, for example, elongating and shortening the elongating/shortening part 141 in accordance with the user's activation operation.

In contrast, the movement controller 104 moves the support 142 to the lowered position and stores the support 142 in the housing 160 by, for example, shortening the elongating/shortening part 141 in accordance with the user's stop operation.

However, the movement controller 104 is also able to stop the support 142 at any position between the raised position and the lowered position by, for example, adjusting an amount of elongation and shortening of the elongating/shortening part 141, as described above.

Further, the movement controller 104 is able to adjust a movement distance of the support 142, for example, on the basis of a tension of the conveyance sheet 130 detected by a tension detector 106 to be described later. That is, the movement controller 104 adjusts the tension of the conveyance sheet 130 by, for example, using the support 142 as a so-called tension bar.

In particular, in a case where the tension of the conveyance sheet 130 is inappropriate in a state in which the support 142 has moved to the raised position, it becomes difficult for the user to view an image displayed by the display panel 150. More specifically, if the tension of the conveyance sheet 130 is insufficient, the non-adjacent parts 130Y1 and 130Y2 are bent, and thus the image displayed by the display panel 150 is also bent. In contrast, if the tension of the conveyance sheet 130 is excessive, the non-adjacent parts 130Y1 and 130Y2 undulate, and thus the image displayed by the display panel 150 also undulates.

Accordingly, for example, in a case where the tension of the conveyance sheet 130 is lower than a reference value, the movement controller 104 further raises the support 142 by further elongating and shortening the elongating/shortening part 141. It is possible to freely set the amount of elongation of the elongating/shortening part 141 in this case, i.e., the movement distance of the support 142. As a result, the tension of the conveyance sheet 130 rises, thereby flattening the non-adjacent parts 130Y1 and 130Y2, and thus, the image displayed by the display panel 150 is also flattened.

In contrast, for example, in a case where the tension of the conveyance sheet 130 is higher than a reference value, the movement controller 104 lowers the support 142 by shortening the elongating/shortening part 141. It is possible to freely set the amount of shortening of the elongating/shortening part 141 in this case, i.e., the movement distance of the support 142. As a result, the tension of the conveyance sheet 130 is reduced, thereby flattening the non-adjacent parts 130Y1 and 130Y2, and thus, the image displayed by the display panel 150 is also flattened.

Further, the movement controller 104 is able to adjust the movement distance of the support 142, for example, on the basis of a result of detecting an external force F by an external force detector 107 to be described later in the state in which the support 142 has moved to the raised position. That is, when the external force F is detected by the external force detector 107, for example, the movement controller 104 adjusts the movement distance of support 142.

Specifically, in the state in which the support 142 has moved to the raised position, the tension of the conveyance sheet 130 is appropriately high to ensure the flatness of the display panel 150. Therefore, if the external force F is unintentionally applied to the conveyance sheet 130, the conveyance sheet 130 may be damaged, and the display panel 150 may be damaged in some cases.

Thus, for example, when the external force F is detected by the external force detector 107, the movement controller 104 rapidly lowers the support 142 by greatly shortening the elongating/shortening part 141. In other words, the movement controller 104 is able to adjust the movement distance of the support 142 to cause the conveyance sheet 130 to bend, by moving the support 142 in a direction to be spaced apart from the inner surface 130B in response to the detection of the external force F, for example. The amount of shortening of the elongating/shortening part 141, that is, the amount of lowering of the support 142 in this case is not particularly limited as long as the amount is enough to intentionally bend the conveyance sheet 130, and may therefore be set to any value. As a result, the tension of the conveyance sheet 130 is temporarily lowered, thus, the conveyance sheet 130 is intentionally bent; therefore, an influence of the external force F on the conveyance sheet 130 is reduced. Accordingly, the conveyance sheet 130 is less likely to be damaged, and the display panel 150 is also less likely to be damaged.

[Slide Controller]

The slide controller 105 controls a sliding operation of the slide mechanism 180. The slide controller 105 includes, for example, a drive source such as a motor or the like, for moving the slide mechanism 180.

Specifically, the slide controller 105 moves the slide mechanism 180 toward the front, for example, in response to the user's operation (forward movement operation). As a result, the conveyance rollers 110 and 120 and the movement mechanism 140 supported by the slide mechanism 180 move toward the front, and thus the display panel 150 also moves toward the front together with the conveyance sheet 130.

In contrast, the slide controller 105 moves the slide mechanism 180 toward the back, for example, in response to the user's operation (backward movement operation). As a result, the conveyance rollers 110 and 120 and the movement mechanism 140 supported by the slide mechanism 180 move toward the back, and thus the display panel 150 also moves toward the back together with the conveyance sheet 130.

[Tension Detector]

In the state in which the support 142 has moved to the raised position, the tension detector 106 detects the tension of the conveyance sheet 130 using the tension sensor 108 and transmits a result of detecting the tension to the movement controller 104.

The tension of the conveyance sheet 130 detected by the tension detector 106 is a tension of one or both of the non-adjacent portions 130Y1 and 130Y2. This is because, in the state in which the support 142 has moved to the raised position, the tension of the non-adjacent parts 130Y1 and 130Y2 exerts an influence on the flatness of the image displayed by the display panel 150.

[External Force Detector]

In the state in which the support 142 is above the raised position, the external force detector 107 detects the external force F (see FIG. 12) supplied to the conveyance sheet 130 using the impact sensor 109 and transmits a result of detecting the external force to the movement controller 104. The impact sensor 109 may include, for example, an acceleration sensor and the like.

The external force F detected by the external force detector 107 is an external force supplied from outside to the non-adjacent portions 130Y1 and 130Y2. This is because in the state in which the support 142 has moved to the raised position, the external force F supplied to the non-adjacent parts 130Y1 and 130Y2 exerts an influence on physical durability of the display panel 150.

It is to be noted that a factor of the external force is not particularly limited. Specifically, the external force F is a force or the like generated attributed to, for example, a collision of an object being erroneously thrown with the conveyance sheet 130.

[Other Components]

It is to be noted that the display device 100 may further include any one or two or more of other component. Other components are not particularly limited, and include, for example, a power source for activating the display device 100.

[1-4. Operation]

Next, an operation of the display device 100 will be described.

Hereinafter, for example, an overall operation of the display device 100 will be described with reference to FIGS. 1 to 12, and then a display operation of the display panel 150 will be described with reference to FIG. 10.

FIGS. 11 and 12 each illustrate a cross-sectional configuration of the display device 100 corresponding to FIG. 3 for describing the operation of the display device 100.

[Overall Operation]

As illustrated in FIGS. 5 to 8, in the display device 100 in an initial state, the support 142 is the located at the lowered position by the elongating/shortening part 141 in the movement mechanism 140 being shortened, thus, the display panel 150 is stored in the housing 160 together with the conveyance sheet 130. The display panel 150 is wound by the conveyance roller 110.

In the initial state, the slide controller 105 adjusts the position of the display panel 150 in the Y-axis direction by moving the slide plate 181 in the Y-axis direction, as necessary.

Specifically, for example, in a case where the display device 100 is installed in the vicinity of a wall in a house and an obstacle such as a window or a curtain is present on the wall, the slide plate 181 may be moved toward the front. This causes the display panel 150 to move forward together with the conveyance sheet 130, thereby moving the display panel 150 away from the obstacle.

Further, for example, in a case where the display panel 150 is too close to a viewing position of the user, the slide plate 181 may be moved toward the back. This causes the display panel 150 to move backward together with the conveyance sheet 130, thereby moving the display panel 150 away from the viewing position of the user.

[Operation at Start of Usage]

To start using the display device 100, the conveyance controller 103 first rotates each of the conveyance rollers 110 and 120. In this case, the conveyance sheet 130 is unwound from the conveyance roller 110 and the conveyance sheet 130 is wound by the conveyance roller 120. This conveys the conveyance sheet 130 from the conveyance roller 110 to the conveyance roller 120, thus, the display panel 150 attached to the conveyance sheet 130 moves from the conveyance roller 110 to the conveyance roller 120.

In this case, the conveyance sheet 130 is nipped by the cleaning mechanism 170 (the cleaning rollers 171 and 172), as described above. As a result, when the conveyance sheet 130 is conveyed, the outer surface 130A is cleaned by the cleaning roller 171 and the inner surface 130B is cleaned by the cleaning roller 172.

The movement controller 104 then drives the movement mechanism 140 when the conveyance sheet 130 moves from the conveyance roller 110 to the conveyance roller 120. In this case, the elongating/shortening part 141 elongates, thus, the support 142 moves from the lowered position to the raised position. As a result, a portion of the conveyance sheet 130 is pushed up by the support 142, and thus, as illustrated in FIGS. 1 to 4, the conveyance sheet 130 is conveyed from the conveyance roller 110 to the conveyance roller 120 along the outer perimeter surface 142M of the support 142.

To move the support 142 to the raised position, the conveyance controller 103 adjusts the position of the display panel 150 by adjusting the rotation direction and the rotation amount of each of the conveyance rollers 110 and 120 such that the display panel 150 is disposed on the non-adjacent part 130Y1 and the display panel 150 is located at a predetermined position in the Z-axis direction. This causes the display surface P to face the front. Thus, the display panel 150 is able to display an image toward the front.

Finally, the display controller 102 drives the display panel 150. This causes the display panel 150 to display the image toward the front.

In this case, the conveyance controller 103 adjusts the position of the display panel 150 in the Z-axis direction by adjusting the rotation direction of the rotation amount of each of the conveyance rollers 110 and 120, as described above. In this case, the position of the display panel 150 is adjusted by using the blank space 130S; therefore, even if the position of the display panel 150 is changed, it is less likely that the display panel 150 is shielded by the housing 160, and that the display panel 150 is curved along the outer perimeter surface 142M of the support 142.

Further, as described above, the movement controller 104 adjusts the tension of the conveyance sheet 130 by adjusting the position (the movement distance) of the support 142 on the basis of the result of detecting the tension of the conveyance sheet 130 obtained by the tension detector 106 using the tension sensor 108.

As a result, the display panel 150 is disposed at a desired position in the Z-axis direction and the display panel 150 becomes flat, and thus, it becomes easier for the user to view the display panel 150.

It is to be noted that, in a case where the conveyance sheet 130 is further conveyed in accordance with the user's operation, as illustrated in FIG. 11, the display panel 150 is disposed on the non-adjacent part 130Y2, and thus, the display surface P faces the back. In this case, the display controller 102 inverts the top and bottom of the image displayed by the display panel 150, as described above. This makes it easier for the user to view the display panel 150 even in the case where the display panel P faces the back.

Further, as described above, when the external force F is detected by the external force detector 107 using the impact sensor 109, the movement controller 104 lowers the support 142 by using the shortening operation of the elongating/shortening part 141, as illustrated in FIG. 12, thus, the conveyance sheet 130 is intentionally bent. As a result, even in a case where the external force F is unintentionally applied to the conveyance sheet 130, the display panel 150 is less likely to be damaged, as well as the conveyance sheet 130. It is to be noted that a circle indicated by a dashed line in FIG. 12 represents the position of the support 142 prior to the detection of the external force F.

[Operation at End of Use]

To terminate the use of the display device 100, the conveyance controller 103 first rotates the conveyance rollers 110 and 120 in opposite directions. In this case, the conveyance sheet 130 is unwound from the conveyance roller 120 and the conveyance sheet 130 is wound by the conveyance roller 110. This makes the conveyance sheet 130 to move from the conveyance roller 120 to the conveyance roller 110, thus, the display panel 150 attached to the conveyance sheet 130 also moves from the conveyance roller 120 to the conveyance roller 110.

Subsequently, the movement controller 104 re-drives the movement mechanism 140 when the conveyance sheet 130 moves from the conveyance roller 120 to the conveyance roller 110. In this case, since the elongating/shortening part 141 is shortened, the support 142 moves from the raised position to the lowered. As a result, a portion of the conveyance sheet 130 pushed up by the support 142 is lowered, and as illustrated in FIGS. 1 to 4, the conveyance sheet 130 is stored in the housing 160 together with the support 142, thus, the display panel 150 attached to the conveyance sheet 130 is also stored in the housing 160.

[Display Operation]

In the display panel 150, holes and electrons recombine in the organic light emitting layer 262 by applying a voltage between the lower electrode layer 261 and the upper electrode layer 263 by using the plurality of driving elements 21, thus, the organic light emitting layer 262 emits light. This causes the red light HR to be generated in the red organic light emitting element 26R, the green light HG to be generated in the green organic light emitting element 26G, and the blue light HB to be generated in the blue organic light emitting element 26B. Accordingly, since the red light HR, the green light HG, and the blue light HB are emitted outside through the color filter 29 and the protective base 20 in this order, a full-color image is displayed on the display surface P on the basis of the red light HR, the green light HG, and the blue light HB.

[1-5. Workings and Effects]

According to the display device 100, the flexible display panel 150 is attached to the conveyance sheet 130 which is conveyable in accordance with the respective rotations of the conveyance rollers 110 and 120, and the movement mechanism 140 (the support 142) disposed between the conveyance rollers 110 and 120 is movable to cause the conveyance sheet 130 to be partially pushed up.

In this case, first, as described above, the display panel 150 is wound up when the display device 100 is not in use (FIGS. 5 to 8) and the display panel 150 is unwound so as to be viewable by the user when the display device 100 is in use (FIGS. 1 to 4), by utilizing the flexibility of the display panel 150 together with the conveyance operation of the conveyance sheet 130 and the movement operation of the support 142. As a result, when the display device 100 is in use, an image is stably viewable by the user on the display panel 150, and when the display device 100 is not in use, the display device 100 is reduced in size.

Second, in a case where the display panel 150 is disposed on the non-adjacent part 130Y1, the display panel 150 is able to display an image toward the front (FIG. 3), and in a case where the display panel 150 is disposed on the non-adjacent part 130Y2 in accordance with the conveyance operation of the conveyance sheet 130, the display panel 150 is able to display an image toward the back. This allows the user to view the image in two directions, (from the front and from the back), using one display device 100.

Third, a height of the display device 100 while being in use is determined in accordance with a height of the support 142 located substantially at the raised position, thus, it is possible to freely change a maximum height of the display device 100 by changing the height of the support 142. This increases a degree of freedom regarding an installation location of the display device 100, thus, it is possible to install the display device 100 in various installation location regardless of a height of the installation location.

From these facts, it is possible to stably view an image while achieving miniaturization of the display device 100 in a non-use state, displaying of an image in multiple directions, and installation of the display device 100 in various installation locations, and therefore, it is possible to obtain excellent convenience.

In particular, if the display panel 150 includes the image display layer 20 supported by the flexible support base 10, the flexibility of the display panel 150 is ensured, which makes it easier for the display panel 150 to be wound up; therefore, it is possible to obtain further higher effects.

Further, if the movement controller 104 is able to adjust the movement distance of the support 142 on the basis of the detection result (the tension of the conveyance sheet 130) of the tension detector 106, the tension of the conveyance sheet 130 is optimized, thus, the flatness of the display panel 150 is improved. Accordingly, it becomes easier for the user to stably view an image; therefore, it is possible to obtain further higher effects.

Further, if the conveyance controller 103 is able to adjust the conveyance distance of the conveyance sheet 130 such that the display panel 150 is disposed on one of the non-adjacent parts 130Y1 and 130Y2 at the time of starting the use of the display device 100, the display panel 150 moves to a position at which the user is able to view the display panel 150 even if the display panel 150 is stored in the housing 160 at the time of not in use. Accordingly, it becomes easier for the user to stably view an image; therefore, it is possible to obtain further higher effects.

In this case, if the movement controller 104 is able to adjust the position of the display panel 150 in the conveyance direction of the conveyance sheet 130 on the basis of the rotational direction and the rotation amount of each of the conveyance rollers 110 and 120, then the position of the display panel 150 is adjusted such that the display panel 150 is disposed at a desired position where it is easy for the user to see an image. This makes it easier to change the position of the display panel 150, in particular by using only the conveyance operation of the conveyance sheet 130, without moving the entire display device 100 in the Z-axis direction. Accordingly, by easily changing the height of the display panel 150, it becomes easy for the user to view the image regardless of a height of the eyes; therefore it is possible to obtain further higher effects.

Further, if the blank space 130S is provided in the conveyance sheet 130 (the non-adjacent parts 130Y1 and 130Y2), it is less likely that the display panel 150 is shielded by the housing 160 and that the display panel 150 is curved along the outer perimeter surface 142M of the support 142, even if the position of the display panel 150 is changed in the conveyance direction of the conveyance sheet 130. Accordingly, a stable image viewing state is maintained; therefore it is possible to obtain further higher effects.

Moreover, if the movement controller 104 is able to adjust the movement distance of the support 142 in accordance with the result of detection (presence or absence of the external force F) obtained by the external force detector 107, the influence of the external force F exerted on the conveyance sheet 130 is reduced. Accordingly, the display panel 150 or the like is less likely to be damaged; therefore it is possible to obtain further higher effects.

Also, if the slide plate 181 is slidable in the Y-axis direction while supporting the conveyance rollers 110 and 120 and the movement mechanism 140, the display panel 150 is moved away from an obstacle such as a window or the like, without moving the entire display device 100. Accordingly, the position of the display panel 150 is easily adjusted in a depth direction; therefore it is possible to obtain further higher effects.

Further, if the display device 100 is provided with the cleaning mechanism 17, the display surface P of the display panel 150 and the like are cleaned by the conveyance operation of the conveyance sheet 130, thus, it is not necessary for the user to clean the display surface P of the display panel 150 and the like again. In addition, display panel 150 and the like are less likely to be damaged than the case where the user manually and directly cleans the display surface P and the like. Accordingly, the display panel 150 or the like is cleaned while the damage of the display panel 150 or the like is suppressed; therefore it is possible to obtain further higher effects.

Still further, if the display device 100 is provided with the housing 160 that stores the display panel 150 or the like, when the display device 100 is not in use, the display panel 150 or the like is stored in the housing 160 (FIGS. 5 to 8), and when the display device 100 is in use, the display panel 150 or the like is drawn out from the housing 160 (FIGS. 1 to 4). As a result, when not in use, the display panel 150 is hidden inside the housing 160, thus, the display panel 150 is not viewed by the user. Accordingly, a design of the display device 100 is improved; therefore it is possible to obtain further higher effects.

2. Modification Example

The configuration of the display device 100 described above may be changed as appropriate. It is to be noted that, as for a series of modification examples described below, any two or more of them may be combined with each other.

Modification Example 1

The number of display panels 150 mounted on the display device 100 is not particularly limited. Specifically, for example, as illustrated in FIG. 13 corresponding to FIG. 3, the display device 100 may include two display panels 150 by adding an additional display panel 150.

With the support 142 having moved to the raised position, the first display panel 150 is disposed on the non-adjacent part 130Y1 and the second display panel 150 is disposed on the non-adjacent part 130Y2.

In this case, unlike the case where the display device 100 has only one display panel 150, it becomes possible to display an image toward the back using the second display panel 150 even if one display panel 150 is not moved using the conveyance operation of the conveyance sheet 130. This allows the first display panel 150 to display the image toward the front and the second display panel 150 to display the image toward the back, thereby allowing the image to be displayed in two directions (toward the front and the back). This makes it possible for a plurality of users to view the image from different directions (from the front and the back); therefore, it is possible to obtain further higher effects.

Contents of the image displayed in the first display panel 150 and contents of the image displayed in the second display panel 150 may be the same or different from each other.

It is needless to say that, although the explanation has been made here with respect to the case where the display device 100 includes two display panels 150, the number of display panels 150 is not particularly limited as described above, and therefore, the number may be three or more. In a case where the number of display panels 150 is three or more, installation locations of the respective display panels 150 may be freely set.

Modification Example 2

The number of movement mechanism 140 mounted on the display device 100 is not particularly limited. Specifically, for example, as illustrated in FIGS. 14 and 15 corresponding to FIG. 3, the display device 100 may include two movement mechanisms 140 by adding an additional movement mechanism 140 (the elongating/shortening part 141 and the support 142).

As illustrated in FIG. 14, for example, the two movement mechanisms 140 are spaced apart from each other at a predetermined distance in the Y-axis direction. More specifically, the first movement mechanism 140 is disposed at side closer to the conveyance roller 110 than the conveyance roller 120, for example, and the second movement mechanism 140 is disposed at side closer to the conveyance roller 120 than the conveyance roller 110, for example. As a result, the conveyance sheet 130 unwound from the conveyance roller 110 is, for example, conveyed along the outer perimeter surface 142M of the first support 142 and then conveyed along the outer perimeter surface 142M of the second support 142, thereby being wound by the conveyance roller 120.

In this case, the conveyance sheet 130 includes, for example, two adjacent parts 130X1 and 130X2, and three non-adjacent parts 130Y1, 130Y2, and 130Y3, in a state in which the support 142 has moved to the raised position. The adjacent part 130X1 is a part adjacent to the outer perimeter surface 142M of the first support 142, and the adjacent part 130X2 is a part adjacent to the outer perimeter surface 142M of the second support 142. The non-adjacent part 130Y1 is a part located between the conveyance roller 110 and the first movement mechanism 140, the non-adjacent part 130Y2 is a part located between the conveyance roller 120 and the second movement mechanism 140, and the non-adjacent part 130Y3 is a part located between the first movement mechanism 140 and the second movement mechanism 140.

In the display device 100, as illustrated in FIG. 14, for example, the conveyance sheet 130 is conveyed until the display panel 150 is disposed on the adjacent part 130Y1, thereby enabling the display panel 150 to display an image toward the front. Though not specifically illustrated here, for example, similarly to the case illustrated in FIG. 11, the conveyance sheet 130 is conveyed until the display panel 150 is disposed on the non-adjacent part 130Y2, thereby enabling the display panel 150 to display the image toward the back. Further, for example, as illustrated in FIG. 15, the conveyance sheet 130 is conveyed until the display panel 150 is disposed on the non-adjacent part 130Y3, thereby enabling the display panel 150 to display the image upward.

Accordingly, the user is able to view the image in three directions (forward, backward, and upward); therefore, it is possible to obtain further higher effects.

It is needless to say that, although the explanation has been made here with respect to the case where the display device 100 includes two movement mechanisms 140, the number of movement mechanisms 140 is not particularly limited as described above, and therefore, the number may be three or more.

Modification Example 3

The support 142 may be a roller which, similarly to each of the conveyance rollers 110 and 120, is rotatable about the X-axis, for example. In this case, the rotation of the support 142 in accordance with the conveyance of the conveyance sheet 130 causes a friction generated between the conveyance sheet 130 and the support 142 (the outer perimeter surface 142M) to be reduced, and therefore, the conveyance sheet 130 is easily conveyed along the outer perimeter surface 142M. Accordingly, the conveyance sheet 130 is easily conveyed smoothly and stably; therefore, it is possible to obtain further higher effects.

Modification Example 4

The cleaning mechanism 170 may include only one of the cleaning rollers 171 and 172, for example. Also in this case, the display panel 150 is cleaned together with the conveyance sheet 130, and thus, it is possible to obtain similar effects. However, when only one of the cleaning rollers 171 and 172 is used, it is preferable to use the cleaning roller 171 capable of cleaning the display surface P, to prevent the display panel 150 from being damaged at the time of winding due to a foreign matter stuck to the display surface P.

Modification Example 5

The cleaning mechanism 170 is not limited to the cleaning rollers 171 and 172 described above as long as it is possible to remove a foreign matter stuck to the conveyance sheet 130 (the outer surface 130A and the inner surface 130B).

Specifically, the cleaning mechanism 170 may be, for example, a blower (a fan or an air blower) that blows away a foreign matter by blowing air to the conveyance sheet 130. Also in this case, the cleaning mechanism 170 may include, for example, a pair of blowers. The pair of blowers, for example, includes a blower that blows air to the outer surface 130A and a blower that blows air to the inner surface 130B.

Also in this case, the display surface P of the display panel 150 and the like are cleaned by the cleaning mechanism 170, and thus, it is possible to obtain similar effects.

Modification Example 6

The type of the elongating/shortening part 141 that moves the support 142 is not limited to the linkage including the plurality of pivot plates 1410 and the plurality of pivot pins 1420 described above. That is, the configuration of the elongating/shortening part 141 may be freely changed, as long as it is possible to move the support 142 in the Z-axis direction by being able to elongate and shorten in the Z-axis direction.

Modification Example 7

Although not specifically illustrated here, additional components may be provided to the display device 100 as necessary, for example. Types of the additional components are not particularly limited. Specifically, an example of the additional components includes a lid member that closes the opening 160K in a state in which the display panel 150 or the like is stored in the housing 160. Further, another example of the additional component includes a cover member that shields the movement mechanism 140 to hide the support 142 or the like in a state in which the support 142 is moved to the raised position.

Although the disclosure is described hereinabove with reference to the example embodiments and modification examples, these embodiments and modification examples are not to be construed as limiting the scope of the disclosure and may be modified in a wide variety of ways.

It should be appreciated that the effects described herein are mere examples. Effects of an example embodiment and modification examples of the disclosure are not limited to those described herein. The disclosure may further include any effects other than those described herein.

It is to be noted that the present disclosure may have the following configurations.

(1) A display device including:
a first rotation member configured to rotate;
a second rotation member configured to rotate, the second rotation member being spaced apart from the first rotation member;
a conveyance member that is extended between the first rotation member and the second rotation member, is configured to be conveyed between the first rotation member and the second rotation member in accordance with respective rotations of the first rotation member and the second rotation member, and has an inner surface and an outer surface;
an abutting movement member that is disposed between the first rotation member and the second rotation member, and is configured to move to cause the conveyance member to be partially pushed up while being abutted against the inner surface; and a display member having flexibility that is attached to the outer surface, and displays an image using an organic light emitting phenomenon.

(2) The display device according to (1), in which the display member includes
a flexible base, and
an image display layer that is supported by the flexible base and displays the image.

(3) The display device according to (1) or (2), further including:
a movement controller that controls movement of the abutting movement member; and
a tension detector that detects a tension of the conveyance member, in which the movement controller is configured to adjust a movement distance of the abutting movement member on a basis of the tension of the conveyance member detected by the tension detector.

(4) The display device according to any one of (1) to (3), further including a conveyance controller that controls conveyance of the conveyance member in accordance with the respective rotations of the first rotation member and the second rotation member, in which
in a state in which the abutting movement member is moved to cause the conveyance member to be partially pushed up while being abutted against the inner surface, the conveyance member includes an adjacent part that is adjacent to the abutting movement member and a non-adjacent part that is not adjacent to the abutting movement member, and
the conveyance controller is configured to adjust a conveyance distance of the conveyance member to cause the display member to be disposed on the non-adjacent part in accordance with the respective rotations of the first rotation member and the second rotation member.

(5) The display device according to (4), in which, in a state in which the display member is disposed on the non-adjacent part, the conveyance controller is configured to adjust a position of the display member in a conveyance direction of the conveyance member in accordance with the respective rotations of the first rotation member and the second rotation member.

(6) The display device according to (5), in which the non-adjacent part has a blank space to which the display member is not attached at at least one of upstream side or downstream side of the display member in the conveyance direction of the conveyance member.

(7) The display device according to any one of (1) to (6), further including:
a movement controller that controls movement of the abutting movement member; and
an external force detector that detects, in a state in which the abutting movement member is moved to cause the conveyance member to be partially pushed up while being abutted against the inner surface, an external force to be supplied to the conveyance member, in which
when the external force is detected by the external force detector, the movement controller is configured to adjust a movement distance of the abutting movement member to cause the conveyance member to bend, by moving the abutting movement member in a direction to be spaced apart from the inner surface.

(8) The display device according to any one of (1) to (7), further including a support movement member that supports the first rotation member, the second rotation member, and the abutting movement member, and is configured to move in a direction that intersects a movement direction of the abutting movement member.

(9) The display device according to any one of (1) to (8), further including a cleaning member that is disposed along a conveyance path of the conveyance member, and is configured to clean at least one of the inner surface or the outer surface.

(10) The display device according to any one of (1) to (9), further including a storage member that stores the first rotation member, the second rotation member, the conveyance member, the abutting movement member, and the display member, in which,
when the abutting movement member moves to cause the conveyance member to be partially pushed up while being abutted against the inner surface, the display member is configured to be drawn out from the storage member together with a portion of the abutting movement member and a portion of the conveyance member.

It should be understood by those skilled in the art that various modifications, combinations, sub-combinations, and alterations may occur depending on design requirements and other factors insofar as they are within the scope of the appended claims or the equivalents thereof.

The invention claimed is:

1. An organic electroluminescence (EL) display device comprising:
a flexible display that is windable or unwindable in a first direction, has first and second ends in the first direction, and includes a plurality of organic light emitting elements;
a movement mechanism that is connected to the first end of the flexible display and is configured to elongate and shorten in the first direction;
a rotation member that is connected to the second end of the flexible display and is configured to wind or unwind the display member therearound in the first direction;
a motor configured to rotate the rotation member such that the flexible display is wound or unwound in the first direction; and
a housing configured to house at least the rotation member and the motor.

2. The display device according to claim 1, wherein the movement mechanism is configured to elongate or shorten in the first direction in accordance with the motor rotating the rotation member to wind or unwind the flexible display around the rotation member in the first direction.

3. The display device according to claim 1, wherein the movement mechanism comprises four pivot plates.

4. The display device according to claim 1, further comprising at least one of:
 a roller configured to clean the flexible display;
  a brush; or
  a blower.

5. The display device according to claim 4, wherein the roller, the brush, or the blower is configured to clean at least a surface on which the organic light emitting elements are disposed.

6. The display device according to claim 4, wherein the housing is configured to further house the roller, the brush, or the blower.

7. The display device according to claim 1, further comprising brushes opposed to each other via the flexible display.

8. The display device according to claim 7, wherein the brushes are disposed between the support and the rotation member in the first direction.

\* \* \* \* \*